United States Patent
O'Brien et al.

(10) Patent No.: US 10,732,217 B2
(45) Date of Patent: Aug. 4, 2020

(54) FERROMAGNETIC RESONANCE TESTING OF BURIED MAGNETIC LAYERS OF WHOLE WAFER

(71) Applicant: INTEL CORPORATION, Santa Clara, CA (US)

(72) Inventors: Kevin P. O'Brien, Portland, OR (US); Kaan Oguz, Beaverton, OR (US); Christopher J. Wiegand, Portland, OR (US); Mark L. Doczy, Beaverton, OR (US); Brian S. Doyle, Portland, OR (US); MD Tofizur Rahman, Portland, OR (US); Oleg Golonzka, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 16/073,688

(22) PCT Filed: Apr. 1, 2016

(86) PCT No.: PCT/US2016/025624
§ 371 (c)(1),
(2) Date: Jul. 27, 2018

(87) PCT Pub. No.: WO2017/171848
PCT Pub. Date: Oct. 5, 2017

(65) Prior Publication Data
US 2019/0049514 A1    Feb. 14, 2019

(51) Int. Cl.
*G01R 31/28*     (2006.01)
*H01L 43/12*     (2006.01)
(Continued)

(52) U.S. Cl.
CPC ......... *G01R 31/2831* (2013.01); *G01N 24/10* (2013.01); *G01R 31/315* (2013.01);
(Continued)

(58) Field of Classification Search
CPC .......... G01R 33/288; A61B 2560/0266; A61B 5/0033; A61B 2562/0223
(Continued)

(56) References Cited

U.S. PATENT DOCUMENTS

| 3,156,850 A | 11/1964 | Walters |
| 2005/0012576 A1 | 1/2005 | Wei et al. |

(Continued)

FOREIGN PATENT DOCUMENTS

WO     2017/171848 A1     10/2017

OTHER PUBLICATIONS

International Search Report and Written Opinion received for PCT Application No. PCT/US2016/025624. dated Dec. 20, 2016. 9 pages.

(Continued)

*Primary Examiner* — Giovanni Astacio-Oquendo
(74) *Attorney, Agent, or Firm* — Finch & Maloney PLLC (57) ABSTRACT

Techniques are disclosed for carrying out ferromagnetic resonance (FMR) testing on whole wafers populated with one or more buried magnetic layers. The techniques can be used to verify or troubleshoot processes for forming the buried magnetic layers, without requiring the wafer to be broken. The techniques can also be used to distinguish one magnetic layer from others in the same stack, based on a unique frequency response of that layer. One example methodology includes moving a wafer proximate to a waveguide (within 500 microns, but without shorting), energizing a DC magnetic field near the target measurement point, applying an RF input signal through the waveguide, collecting reso-
(Continued)

nance spectra of the frequency response of the waveguide, and decomposing the resonance spectra into magnetic properties of the target layer. One or both of the DC magnetic field and RF input signal can be swept to generate a robust set of resonance spectra.

20 Claims, 7 Drawing Sheets

(51) Int. Cl.
  *G01R 33/09* (2006.01)
  *G01R 31/315* (2006.01)
  *H01L 21/66* (2006.01)
  *G01R 33/60* (2006.01)
  *G01N 24/10* (2006.01)
  *G01R 35/00* (2006.01)
(52) U.S. Cl.
  CPC ........... *G01R 33/098* (2013.01); *G01R 33/60* (2013.01); *H01L 22/14* (2013.01); *H01L 43/12* (2013.01); *G01R 35/00* (2013.01)
(58) Field of Classification Search
  USPC ........................................ 324/300, 263, 301
  See application file for complete search history.

(56) References Cited

U.S. PATENT DOCUMENTS

| | | |
|---|---|---|
| 2006/0246822 A1 | 11/2006 | Swedek et al. |
| 2010/0023287 A1 | 1/2010 | Worledge et al. |
| 2010/0171494 A1 | 7/2010 | Yanagisawa |
| 2012/0326712 A1 | 12/2012 | Tudosa et al. |
| 2016/0178714 A1* | 6/2016 | Fautz ................... G01R 33/483 324/309 |
| 2017/0319097 A1* | 11/2017 | Amthor ................. A61B 5/055 |
| 2018/0024214 A1* | 1/2018 | Bhat .................. G01R 33/5617 324/309 |

OTHER PUBLICATIONS

International Preliminary Report on Patentability received for PCT Application No. PCT/US2016/025624. dated Oct. 11, 2018. 6 pages.
"Basic Magnetism," originally retrieved from the Internet on Mar. 25, 2016. 30 pages.
Janssen, Paul, "FMR Measurements on Amorphous and Crystalline CoFeB Trilayer Structures," Presented Aug. 28, 2007, MINT Center, The University of Alabama. 29 pages.
Sato, et al., "Investigation of Extrinsic Damping through Elliot-Yafet Mechanism in Perpendicular Ta-CoFeB-MgO System using Vector Network Analyzer Ferromagnetic Resonance Technique," Physical Review B. Originally retrieved from the internet on Mar. 20, 2016. 9 pages.
Sato, et al., Investigation of extrinsic damping caused by magnetic dead layer in Ta-CoFeB-MgO multilayers with perpendicular anisotropy, AIP Journal of Applied Physics 119, 093902 (2016); doi: 10.1063/1.4941943. 9 pages.
Kalarickal, et al., "Ferromagnetic resonance linewidth in metallic thin films: Comparison of measurement methods," Journal of Applied Physics 99, 093909 (2006). 7 pages.
Zhang, et al., "Compact Modeling of Perpendicular-Anisotropy CoFeB/MgO Magnetic Tunnel Junctions," IEEE Transactions on Electron Devices, vol. 59, No. 3, Mar. 2012. pp. 819-826.
Lambert, et al, "Quantifying perpendicular magnetic anisotropy at the Fe-MgO(001) interface," Applied Physics Letters 102, 122410 (2013). 4 pages.

* cited by examiner

FERROMAGNETIC RESONANCE TESTING OF BURIED MAGNETIC LAYERS OF WHOLE WAFER

BACKGROUND

Many semiconductor circuits include buried magnetic layers. For instance, a magnetic tunnel junction (MTJ) device is a magnetoresistive device whose resistance is programmable and can be set to either a high resistivity or low resistivity state in response to an applied magnetic field. The difference in resistance between these two states is generally referred to as the magnetoresistance (MR) ratio, which can range for instance from less than 10% to several hundred to percent or more, depending on the temperature and materials from which the device is made. A typical MTJ device configuration includes an insulator layer of tunneling oxide sandwiched between two ferromagnetic layers respectively referred to as the fixed and free layers. The direction of the magnetic field in the free layer determines whether the MTJ device is in the high resistivity state or in the low resistivity state. A binary zero can be stored in the MTJ device by changing its resistance to the low resistivity state, and a binary one can be stored by changing its resistance to the high resistivity state. Advantageously, no static power is required to maintain the resistance state once set. If the insulator layer is sufficiently thin, electrons may pass from one ferromagnetic layer to the other via quantum tunneling through the insulator layer. The two ferromagnetic layers of a given MTJ typically exhibit magnetic anisotropy—a directional dependence of their magnetic properties. Depending upon the direction of magnetization of its constituent ferromagnetic layers, a given MTJ may be classified as exhibiting either in-plane magnetic anisotropy or out-of-plane magnetic anisotropy. An in-plane MTJ is one in which the direction of magnetization is along the plane of the two ferromagnetic layers. Conversely, an out-of-plane MTJ is one in which the direction of magnetization is orthogonal to the plane of the constituent ferromagnetic layers. The two ferromagnetic layers may be configured such that their respective magnetizations are aligned either in the same direction—the parallel (P) state, or in opposing directions—the anti-parallel (AP) state.

Regardless of the specific device being fabricated, manufacturing integrated circuitry that includes one or more magnetic layers typically necessitates tight magnetic process control, so as to provide ferromagnetic layers having specific magnetic qualities suitable for a given application. Currently, in order for such magnetic layers to be tested, one has to break a fully processed wafer or otherwise fabricate a representative stack to access or otherwise monitor the magnetic properties of the given MTJ stack. Thus, there is a need for techniques for testing buried magnetic layers of integrated circuits.

DETAILED DESCRIPTION

Techniques are disclosed for carrying out ferromagnetic resonance (FMR) testing on whole wafers populated with integrated circuitry including one or more buried or otherwise inaccessible magnetic layers. The techniques can be used to verify or troubleshoot processes used to form the buried magnetic layers of the wafer, without requiring the wafer to be broken. In some example cases, the wafer may include a plurality of diverse buried magnetic layers, such as various fixed and free layers of a magnetic tunnel junction (MTJ) stack. In such cases, the techniques provided herein can be used to distinguish one magnetic layer from others in the same stack, based on a unique frequency response of that layer.

General Overview

As previously explained, manufacturing integrated circuitry that includes a stacked configuration of one or more magnetic layers typically necessitates tight magnetic process control, so as to provide ferromagnetic layers having specific magnetic qualities. Common methods to measure magnetics are SQUID and MOKE. SQUID, which refers to superconducting quantum interference device, is a magnetometer used to measure very subtle magnetic fields. However, the sample to be tested must be broken in order for testing to be carried out. Also the magnetics are combined into one signal, so it is not possible to distinguish the difference between different layers, such as the free and fixed layer magnetics of an MTJ. MOKE, which refers to magneto-optic Kerr effect, relies on light reflected from a magnetized surface and therefore can only measure the magnetics of a topmost or otherwise exposed layer. Moke therefore cannot measure a magnetic film buried under other films. Consider, for example, an MTJ configuration that includes a 50 nm hardmask of tantalum deposited over the magnetic stack. In such cases, a MOKE test will not generate a measurable signal.

Thus, techniques are disclosed for carrying out ferromagnetic resonance (FMR) testing on whole wafers populated with integrated circuitry having one or more buried or otherwise inaccessible magnetic layers. In one example embodiment, the techniques are implemented as a system including a means for providing relatively high field magnetic, a waveguide positioned close to the wafer and configured to shape the magnetic field, and an analysis component (e.g., software executable by a computer). The waveguide shape is configured to provide localization of the magnetic field, so that small portions of the wafer can be tested individually, without implicating other magnetic portions of the wafer. Using a positional robot or other moving means, the target test position of the wafer can be changed so as to allow for measuring of FMR signals across the entire wafer or otherwise at select locations of the wafer. In some example embodiments, the magnetic field is energized and a high frequency RF input is applied to the waveguide and swept across a target frequency band using a network analyzer also connected to the output of the waveguide. A target buried magnetic layer causes a change in the impedance of the waveguide. The frequency response of the waveguide, as measured by the network analyzer, reflects the change in waveguide impedance. The analysis component of the system receives the FMR spectra associated with the frequency response of the waveguide (including the impedance changes), and is programmed or otherwise configured to correlate that FMR spectra with magnetic properties of the target magnetic layer.

Thus, magnetic properties of a given buried magnetic layer can then be extracted from the FMR signals measured for that layer. The properties include, for example, a (damping), Hkeff (effective anisotropy field), g (magnetic moment), ΔH (FMR linewidth), and $\Delta H_0$ (inhomogeneous linewidth broadening). Once these magnetic properties are known, performance data about the magnetic layer can be determined or otherwise confirmed. For instance, the intrinsic threshold current of a perpendicular MTJ may be computed by the equation $2\alpha\gamma E/\mu_B \eta$, where $\alpha$ is the damping parameter, $\gamma$ is the gyromagnetic ratio, e is the elementary charge, E is the energy barrier between the parallel and antiparallel states, $\mu_B$ is the Bohr magneton, and $\eta$ is the spin transfer efficiency. The techniques can be applied to any number of integrated circuits having buried magnetic layers, such as memory circuits including, for instance, spin transfer torque memory (STTM) and resistive random access memory (RRAM) and any other circuitry having buried magnetic layers.

Note that the wafer may be partially or fully processed and need not be broken in order to carry out the testing. The techniques can be used to verify or troubleshoot processes used to form the buried magnetic layers of the wafer. In some example cases, the wafer may include a plurality of diverse buried magnetic layers, such as various fixed and free magnetic tunnel junction (MTJ) layers. In such cases, the techniques provided herein can be used to distinguish one magnetic layer from others in the same stack, based on a unique frequency response of that layer. As further explained herein, FMR-based wafer level testing as provided herein can be used to measure damping which is directly proportional to, and can therefore be correlated to, the critical current in a MTJ. Thus, magnetic layer fabrication processes can be verified with respect to resulting circuit performance.

System Architecture

Figure 1A:
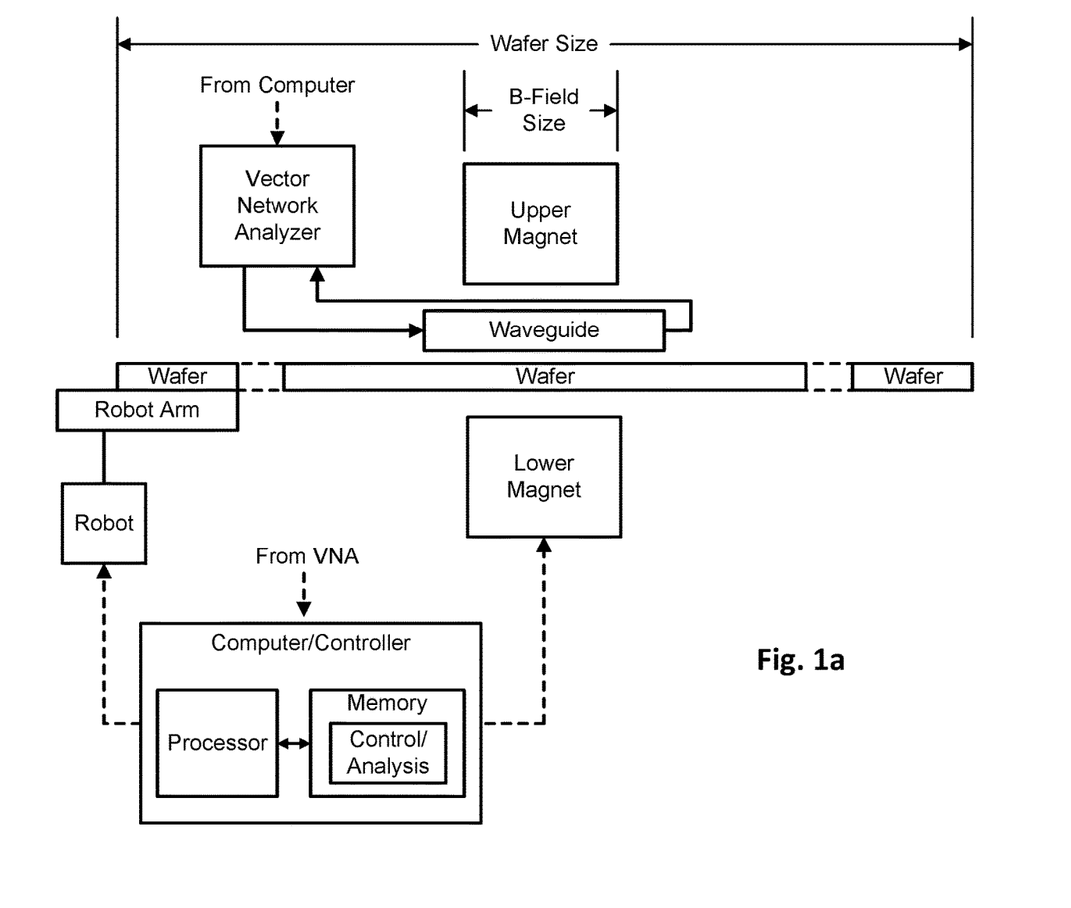
FIG. 1a illustrates a system for carrying out wafer level ferromagnetic resonance (FMR) testing of processes used to form magnetic layers of an integrated circuit, in accordance with an embodiment of the present disclosure.

FIG. 1a illustrates a system for carrying out wafer level ferromagnetic resonance (FMR) testing of processes used to form magnetic layers of an integrated circuit, in accordance with an embodiment of the present disclosure. As can be seen, the system includes a waveguide positioned between upper and lower magnets. The input and output of the waveguide are respectively connected to a high-frequency source and receiver of a vector network analyzer (VNA). In addition, the example embodiment uses a robot to position a whole wafer between the magnets and proximate to the waveguide, but without short-circuiting the conductor of the waveguide. As can further be seen, a computer or controller unit can be used to control the functionality of the system, which in one example case includes positioning of the wafer by the robot, application of the magnetic field via the upper and lower magnets, application of the VNA high frequency source to the waveguide, interpreting the frequency response spectra measured by the VNA, and extracting magnetic properties of a given buried magnetic layer based on the frequency response spectra. With the magnetic properties of the layer known, various performance parameters of that magnetic layer can also be known, such as critical current in a MTJ.

Note that the components are illustrated as separate components, for purposes of clarity. However, other embodiments may be configured differently, but still provide similar functionality. For instance, in some cases, the waveguide can be integrated into one of the magnets, such as the upper magnet. In such a case, the upper magnet can be drilled or otherwise formed with a passage that passes through the block of magnet material (either by way of an internal channel through the magnet, or an external channel formed in the side of the magnet, or a combination of such internal and external passages). The conductor of the waveguide (e.g., copper wire, or other suitable conductor) can then be placed in the passageway, and an insulating material (e.g., alumina, or other suitable dielectric material) can be provided around that conductor, such that the conductor doesn't touch or otherwise short to the magnet body. Any number of such integrated arrangements will work, so long as a high-frequency signal can be passed through the waveguide being subjected to the magnetic field. Numerous such configurations and variations will be apparent in light of this disclosure.

The upper and lower magnets can be implemented with any typical magnetic materials, such as cobalt, iron, nickel, lodestone, and various alloys of rare earth metals. The distance between the magnets can vary depending on factors such as the thickness of the waveguide, thickness of the wafer under test, the strength of the magnetic field strength (B), and the frequency range of the high-frequency source, but in some embodiments is in the range of about 1 cm to 3 centimeters (cm) or less. The magnetic field strength (B-field) may also vary from one embodiment to the next, but in some example cases is in the range of about 0.5 to 4.0 Teslas (T). The frequency range of the high-frequency source of the VNA may also vary from one embodiment to the next, but in some example cases is swept from about, for example, 1 GHz to 100 GHz, with signal power in the range of −20 dBm to +50 dBm.

One specific example use case is configured as follows. The upper and lower magnets are implemented with iron magnets vertically spaced about 1 cm apart from one another (or less), and provide a B-field in the range of 1 T to 3 T, such as 1.8 T or a combination of different DC fields within a given range (e.g., in a range from 0 T to 3 T, take measurements at 0.5 T, 1.0 T, 1.5 T, 1.8 T, 2.0 T, and 2.5 T). Generally, it does not matter how close the lower magnet is to the wafer backside, except it may limit the field, but in some embodiments, the lower magnet is touching the wafer backside or up to 1 millimeter (mm) away from the wafer backside. In addition, the waveguide is very close to the upper magnet, and the magnetic layer being tested is very close to the conductor of the waveguide. In some embodiments, the term "very close" refers to being within a few hundred microns or less (e.g., 500 microns or less), and in some further embodiments, within microns or less, but not touching so as to cause a short-circuit. Continuing with the example use case, the high-frequency source of the VNA is swept from about 2 GHz to 70 GHz, at signal power in the range of about −10 dBm to +10 dBm. In a more general sense, the spacing of the componentry, magnetic field strength, frequency range, and RF signal power can be adjusted to accommodate a given set of magnetic layers and the performance parameters associated with those magnetic layers, as will be appreciated.

The robot can be implemented with any standard robot technology, such as that commonly used in wafer handling applications within process chambers, for instance. In some embodiments, the robot arm may have a U-shaped end so that only the outermost perimeter of the wafer is in contact with the arm, thereby leaving the majority of the wafer available for testing while being held in position by the robot. In still other embodiments, the robot arm may be configured with a vacuum chuck or an electrostatic chuck configured to hold the wafer in place with only minimal contact at the perimeter of the wafer. In such cases, note that the wafer may be held from the bottom or top surface of the wafer, even though the figure shows the wafer being held by its bottom surface. In any such cases, the robot can be commanded or otherwise programmed to incrementally move the wafer proximate and very close to the waveguide (within a few hundred microns or less, but without shorting), so that localized testing of small portions of the whole wafer can be tested for magnetics. In still other embodiments, the wafer can be moved manually by a test technician or by means other than a robot. To this end, a robot is not needed in all embodiments of the present disclosure.

The VNA can be any commercial or proprietary RF signal source and RF signal analyzer arrangement. Some suitable examples that could be used for the VNA are the N5227A Microwave Network Analyzer and the HP8510c Vector Network Analyzer, both from Agilent Technologies. In a more general sense, and as will be appreciated, the VNA can be selected or designed based on the frequency range of interest and the signal power suitable for testing the targeted magnetic layers.

The computer/controller can be implemented with any suitable computing environment, such as a desktop or laptop computer with typical processing power and input/output (I/O) capability. The I/O capability is configured to receive input from the other components of the system (such as frequency response data output by the VNA), and to send output data to the other components of the system (such as measurement command to the VNA, and control commands to the robot, and on/off commands to the magnetic field generator). Further note that such I/O may be integrated within the computer/controller, or otherwise communicatively coupled with the computer via a suitable communication bus (e.g., general purpose interface bus, or GPIB). For instance, commands between the computer/controller and the VNA can be provided over a GPIB bus, in some embodiments. Numerous such interface and I/O schemes can be used, and the present disclosure is not intended to be limited to any particular ones. In any case, the computer/controller will generally include one or more processors and a memory facility for storing executable code or to instructions and data as normally done. In this example embodiment, the memory is communicatively accessible by the processor, and has a control/analysis module stored therein. When executed by the processor, the control/analysis module is programmed or otherwise configured to carry out wafer level FMR testing of magnetic layers of an integrated circuit, in accordance with an embodiment of the present disclosure. Note that the computer/controller may be, in some embodiments, a microcontroller configured with an onboard processor, memory, and I/O capability, and configured to carry out the various methodologies provided herein, such as will be discussed with reference to FIG. 2. Numerous suitable processing environments can be used, as will be appreciated.

Figure 1B:
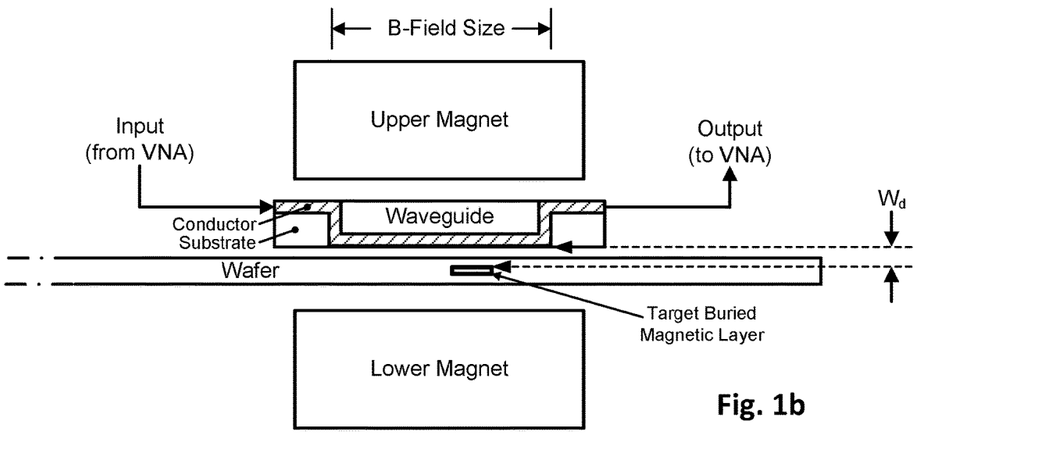
FIG. 1b illustrates further details of an example waveguide that can be used in the system of FIG. 1a, in accordance with an embodiment of the present disclosure.

FIG. 1b illustrates further details of an example waveguide that can be used in the system of FIG. 1a, in accordance with an embodiment of the present disclosure. As can be seen, the waveguide is configured with a substrate through which a conductor meanders or otherwise passes. The substrate can be, for example, alumina, and the conductor can be a copper wire, but any number of suitable such waveguide configurations can be used, as will be appreciated. As can be further seen, the waveguide of this example embodiment has a step function, which allows for the s-parameter signal (S21, forward gain) to only originate underneath the upper magnetic yoke. As can be further seen, a buried magnetic layer (which is at least one of on and in the wafer) has an upper surface that is within a distance $W_d$ of the waveguide conductor. As will be appreciated, $W_d$ can vary from one embodiment to the next, but in some example cases is 500 microns or less, or even 5 microns or less, but in no case are the target magnetic layer and waveguide conductor physically touching. In some cases, the waveguide conductor may be coated with a dielectric. In such cases, the target magnetic layer and coated waveguide conductor may actually be physically touching, so long as no electrical short-circuit to the waveguide conductor is formed by virtue of that touching. Note that the distance between the topmost surface of the populated wafer and the waveguide body may be one distance (e.g., less than 5 microns), while the distance $W_d$ between the target buried magnetic layer and the waveguide conductor may be another slightly longer distance (e.g., less 300 microns). That is not to say, however, that the distance $W_d$ cannot be very short. To be clear, in some embodiments, the distance $W_d$ is less than 5 microns (e.g., 0.5 microns, in some cases).

Figure 1C:
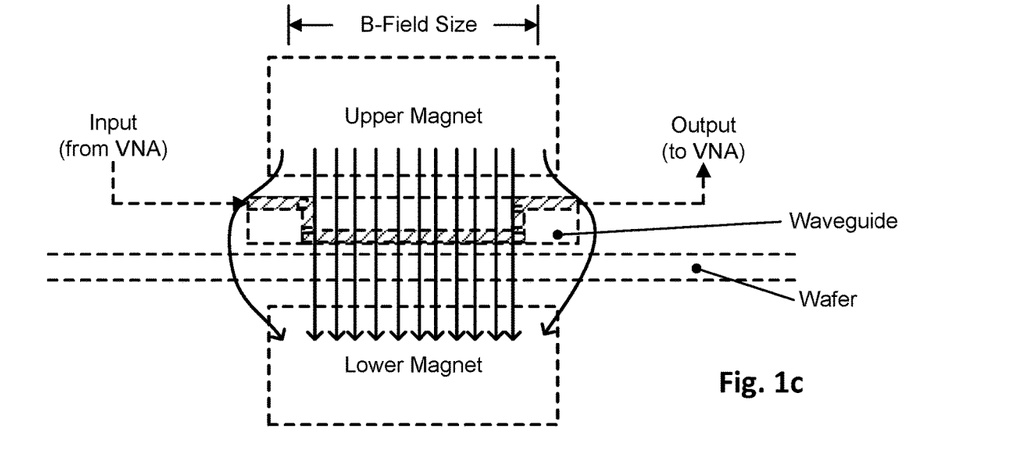
FIG. 1c illustrates an example magnetic field generated by the system of FIG. 1a, in accordance with an embodiment of the present disclosure.
Figure 1D:
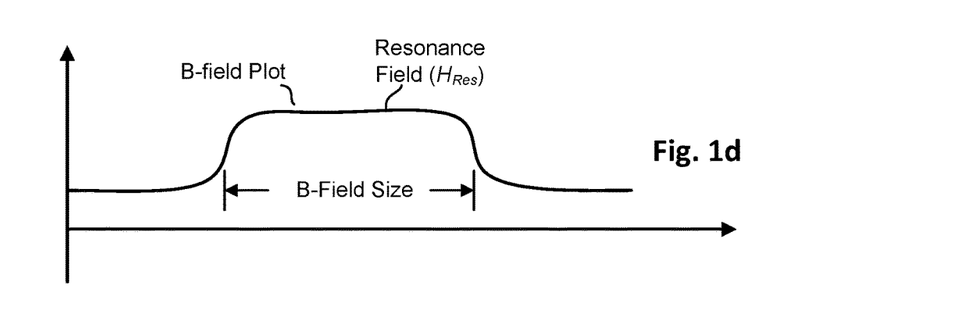
FIG. 1d illustrates a plot of an example magnetic field generated by the system of FIG. 1a, in accordance with an embodiment of the present disclosure.

The resulting magnetic field B is shown in FIG. 1c (by way of downward pointing arrows), and a corresponding plot of that field in shown in FIG. 1d. Note how the B-field size generally corresponds to the size of the magnet and the step function provided by the waveguide, and therefore also defines the resonance field ($H_{Res}$). Said differently, the frequency response of the waveguide is centered on the resonance field (see also FIG. 2c, which will be discussed in turn). In one example embodiment, the magnet is about 1 cm or 2 cm wide (in the lateral, left-right direction) or smaller, and the step function causes a B-field size that is slightly smaller than that width. In one specific such example embodiment, the magnet is about 1 cm wide and the B-field is about 4 mm wide, while in another specific example the magnet is about 2 cm wide and the B-field is about 1 cm wide.

In any such cases, the waveguide can be configured with a step function so as to allow for localization of the B-field. The step function waveguide shown in the example embodiment of 1a-c has uniform field within the measurement B-field. Further note that the conductor of the waveguide is configured such that it is physically away from the wafer except under the upper magnet, which in turn ensures that the magnetic B-field is constant. Thus, the system can be programmed or otherwise configured to measure properties of ferromagnetic resonance in a DC magnetic field at gigahertz (GHz) frequencies. The collected resonance spectra can be decomposed into magnetic properties, for example damping. During testing, the buried magnetic layer of the whole wafer causes a change in the impedance of the waveguide, and these changes in impedance can be correlated with magnetic properties. So, in one example use case, the system is used for monitoring 300 mm wafers populated with magnetic memories such as pSTTM, and to ensure magnetics are in line with expectations.

Methodology

Figure 2A:
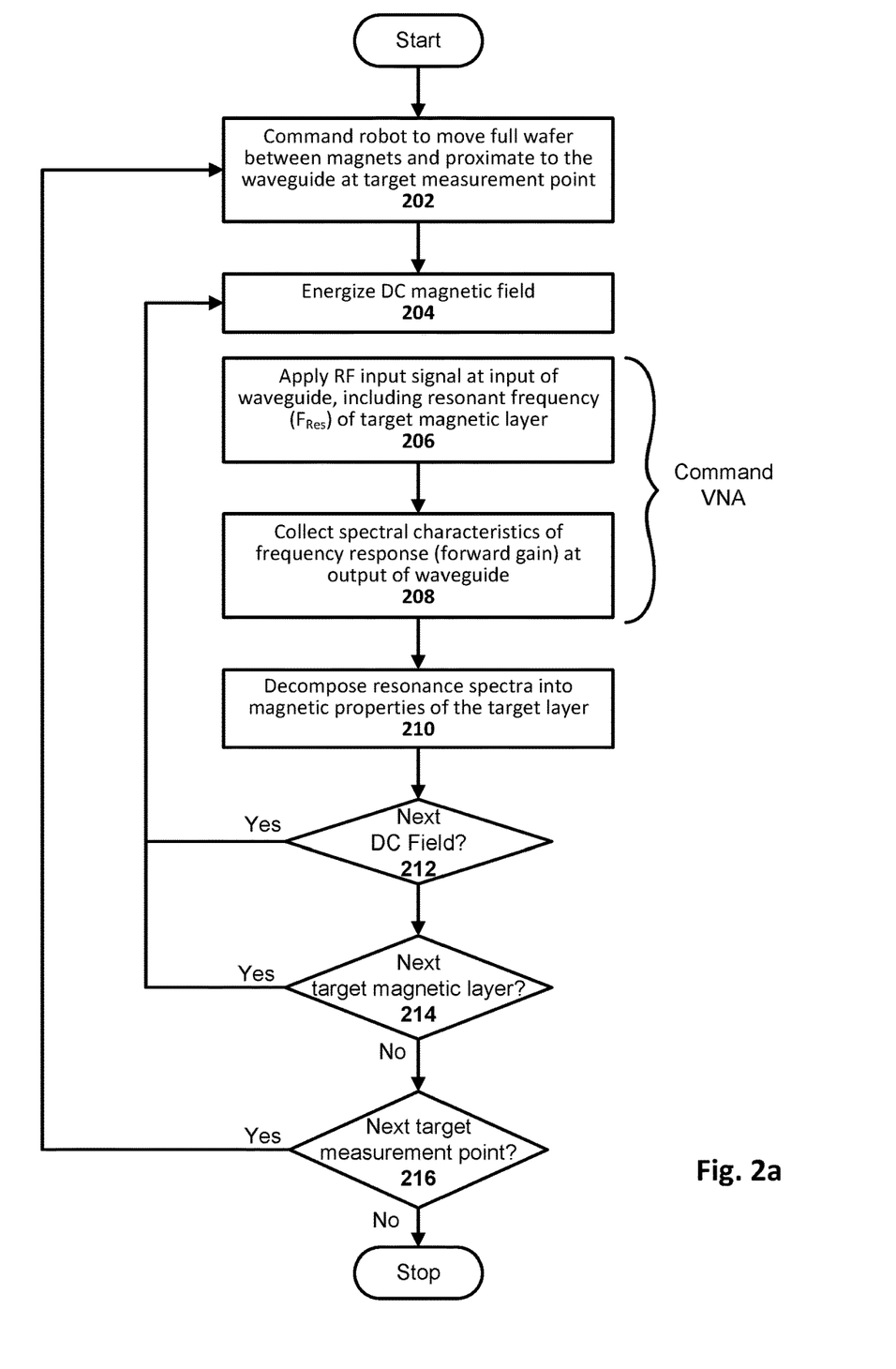
FIG. 2a illustrates a method for carrying out wafer level ferromagnetic resonance (FMR) testing to verify or troubleshoot processes used to form magnetic layers of an integrated circuit, in accordance with an embodiment of the present disclosure.

FIG. 2a illustrates a method for carrying out wafer level ferromagnetic resonance (FMR) testing to verify or troubleshoot processes used to form magnetic layers of an integrated circuit, in accordance with an embodiment of the present disclosure. The method can be coded, for example, into the control/analysis module of the system shown in FIG. 1 and carried out upon execution of that module by the processor, although any number of other embodiments will be apparent in light of this disclosure. The control/analysis module and one or more processors capable of executing that software module can collectively operate as a functional control/analysis circuit. Alternatively, the control/analysis circuit may be implemented in hardware, such as with gate level logic or a field programmable gate array (FPGA), or an application specific integrated circuit (ASIC), or other purpose-built semiconductor configured to carry out the methodology, or a microcontroller having a processor for executing embedded routines configured to carry out the methodology and a number of input/output ports (e.g., input port for receiving frequency response data from VNA, and output port for sending control signals to VNA, circuitry controlling the magnetic field, and robot). In a more general sense, the methodology can be implemented in hardware, software, firmware, or some combination therefore.

Figure 2B:
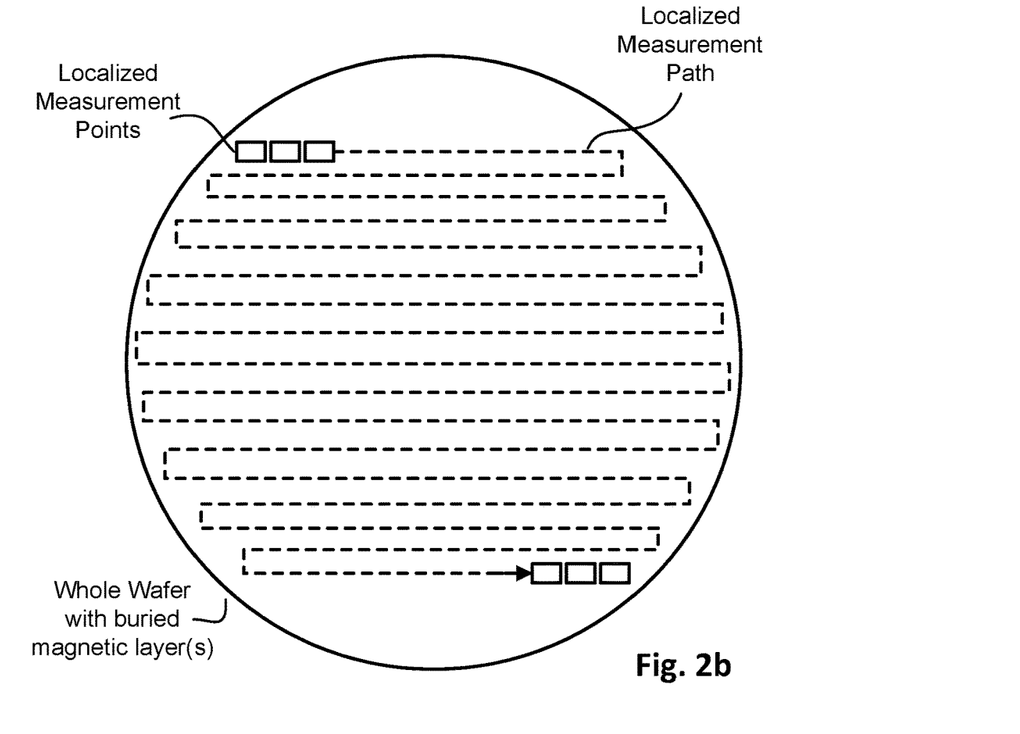
FIG. 2b illustrates an example whole wafer populated with various integrated circuitry, which can be subjected to a series of localized FMR-based testing using the methodology of FIG. 2a, in accordance with an embodiment of the present disclosure.

The method includes commanding 202 the robot to move the full wafer between the magnets and proximate to the waveguide at target measurement point. The wafer may be, for instance, a 300 mm wafer populated with integrated circuitry including one or more buried magnetic layers, such as a wafer of magnetic memory chips, or a wafer of processors configured with on-board magnetic memory or cache. An example wafer is shown in FIG. 2b, which further shows a series of localized measurement points along a localized measurement path, according to one embodiment. Other embodiments may include few measurement points and/or a different measurement path, as both the measurement points and measurement path are based on a given wafer layout and therefore arbitrary. In any case, the target point commanded at 202 can be any one of the given measurement points provided for a given whole wafer. Recall that the target magnetic layer is placed very close to the waveguide conductor, but without short-circuiting the waveguide conductor. As discussed with reference to the example embodiment shown in FIG. 1b, this distance is designated as $W_d$ (distance from waveguide conductor to target magnetic layer).

In some example embodiments, the target magnetic layer is placed within 500 microns of the waveguide conductor or less, or within 400 microns of the waveguide conductor or less, or within 300 microns of the waveguide conductor or less, or within 200 microns of the waveguide conductor or less, or within 100 microns of the waveguide conductor or less, or within 50 microns of the waveguide conductor or less, or within 25 microns of the waveguide conductor or less, or within 10 microns of the waveguide conductor or less, or within 5 microns of the waveguide conductor, or within 0.5 microns of the waveguide conductor, but in no case are the target magnetic layer and waveguide conductor physically touching so as to cause an undesired shorting condition. In still other embodiments, $W_d$ may be greater than 500 microns, so long as that distance $W_d$ doesn't preclude measurement of the magnetic properties of the target buried magnetic layer as variously provided herein.

The method continues with energizing 204 the DC magnetic field, and applying 206 the RF input signal at input of waveguide, including resonant frequency ($F_{Res}$) of target magnetic layer. Recall that either or both of the DC magnetic field and the RF input signal can be swept. In one example case, the DC magnetic field (or B-field) is set to 1.8 T, and the RF input signal is swept from 10 GHz to 50 GHz, at a power level in the range of −10 dBm to +10 dBm. In still other embodiments, the DC magnetic field is swept as well. For instance, in one such example case, the DC magnetic field is swept in the range of 0 T to 3 T (such that resonance spectra measurements collected at 208 are taken at multiple fields within this range, such as at 0.5 T, 1.0 T, 1.5 T, 1.8 T, 2.0 T, 2.5 T, and 3.0 T), while the RF input signal is swept from 2 GHz to 70 GHz, at a power level in the range of −10 dBm to +10 dBm. In still other embodiments, the RF signal input is set (not swept), and only the DC magnetic field is swept. For instance, in one such example case, the DC magnetic field is swept from 0 T to 3 T (such that resonance spectra measurements collected at 208 are taken at multiple fields within this range), while the RF input signal is set in the range of 10 GHz to 50 GHz, at a power level in the range of −10 dBm to +10 dBm. Once the resonant spectra have been collected at 208 for that DC field and frequency, the RF input signal can be set to a next value and the process repeated. Such iteration can be carried out a number of times to sufficiently cover a frequency range of interest. In some such embodiments, for instance, the iteration is carried out at 0.5 GHz increments. The resonant spectra collected at 208 can then be decomposed into magnetic properties of layer at 210, as will be discussed in turn. As will be appreciated, the strength of the magnetic field and the frequency of RF input signal can vary from one embodiment to the next, and the present disclosure is not intended to be limited to any particular range of field strengths or frequency range. In any case, the method continues with collecting 208 spectral characteristics of frequency response (forward gain) at output of waveguide, as previously noted. Note that the applying at 206 and the collecting at 208 can be accomplished using, for example, any commercially available VNA.

The method continues with decomposing 210 the resonance spectra into magnetic properties of the target layer. This can be accomplished, for instance, by first determining magnetic susceptibility, which is a dimensionless proportionality constant that indicates the degree of magnetization of a material in response to an applied magnetic field. Susceptibility at a given frequency f can be defined in Equation 1.

$$X(f) = X' + jX''$$ (Equation 1)

Figure 2C:
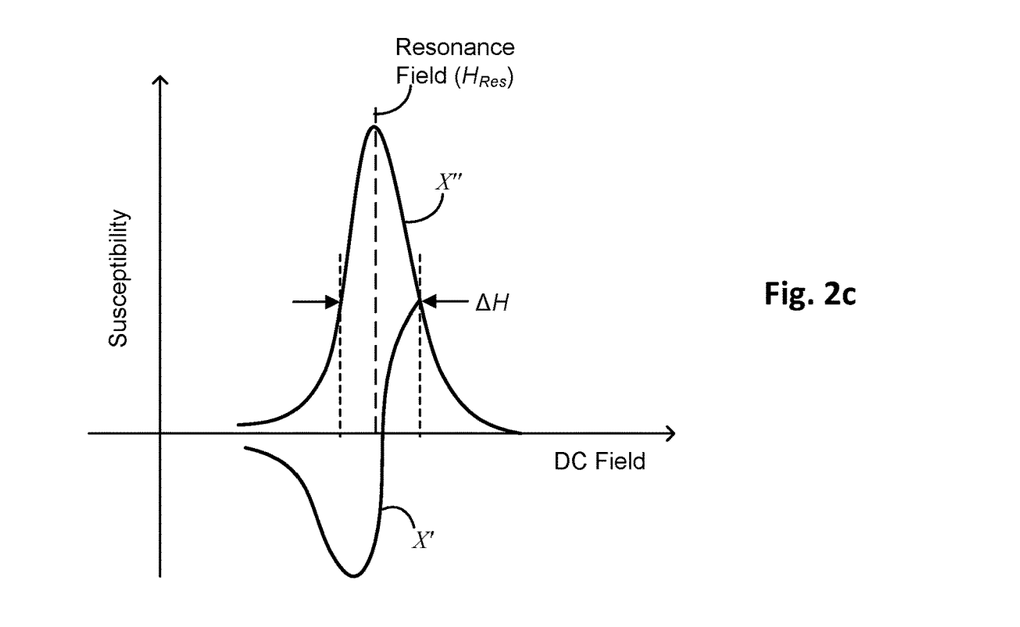
FIG. 2c illustrates an example plot of magnetic susceptibility and how parameters such as damping and inhomogeneous linewidth broadening can be determined therefrom, in accordance with an embodiment of the present disclosure.

As can be seen, susceptibility X has a real component (X') and an imaginary component (jX"). FIG. 2c illustrates an example plot of magnetic susceptibility and how magnetic properties of the target layer such as damping and inhomogeneous linewidth broadening can be determined therefrom, in accordance with an embodiment of the present disclosure. As can be seen, the FMR linewidth $\Delta H$ is centered around the resonance field ($H_{Res}$). FMR linewidth $\Delta H$ at a given RF input frequency f can be defined as shown in Equation 2.

$$\Delta H = \frac{4\pi\alpha f}{|\gamma|\mu_0} + \Delta H_0 \quad \text{(Equation 2)}$$

As previously noted, $\alpha$ is the damping parameter, $\gamma$ is the gyromagnetic ratio, $\Delta H$ is FMR linewidth, and $\Delta H_0$ is the inhomogeneous linewidth broadening. In addition, f represents the RF input frequency, and $\mu_0$ is the permeability in free space. Given the knowns, Equation 2 can be solved for the damping parameter $\alpha$. The effective magnetization $M_{eff}$ can also be determined, from Equation 3.

$$\Delta H_{Res} = \frac{2\pi f}{|\gamma|\mu_0} + M_{eff} \quad \text{(Equation 3)}$$

Once the magnetic properties of the target layer are determined, changes to the semiconductor fabrication process can be made, so as to fine tune or otherwise adjust the magnetic properties of that target layer as desired. As will be further appreciated, the determined magnetic properties can also be used to troubleshoot or verify that the target layer has the intended magnetic properties. For instance, the switching current is proportional to the $\alpha$ (damping). Thus, if the damping $\alpha$ is smaller than expected, then the switching current will likely also be lower than expected. Adjustments can be made to the magnetic processes based on such proportional relationships.

The method continues with determining 212 if there are additional field strengths to test at the current RF signal frequency. If so, the method repeats starting at 204, with the next DC magnetic field strength. If no further DC fields are desired for the current RF signal frequency, then the method continues with determining 214 if there are additional target layers to measure at the current wafer location. If so, the method repeats starting at 204 for the next target magnetic layer. Note the DC field can be changed at 204 to suit a target layer, as can the frequency of the RF signal at 206. If it is determined at 214 that there are no additional target layers to measure at that particular measurement location, then the method continues with determining 216 if there is a next target measurement point. If so, the method repeats starting at 202, wherein the robot is commanded to position the wafer so that the target measurement location is proximate to the waveguide (and the measurement process repeats as previously described). Otherwise, if no further measurement point at 216, the method concludes.

Figure 2D:
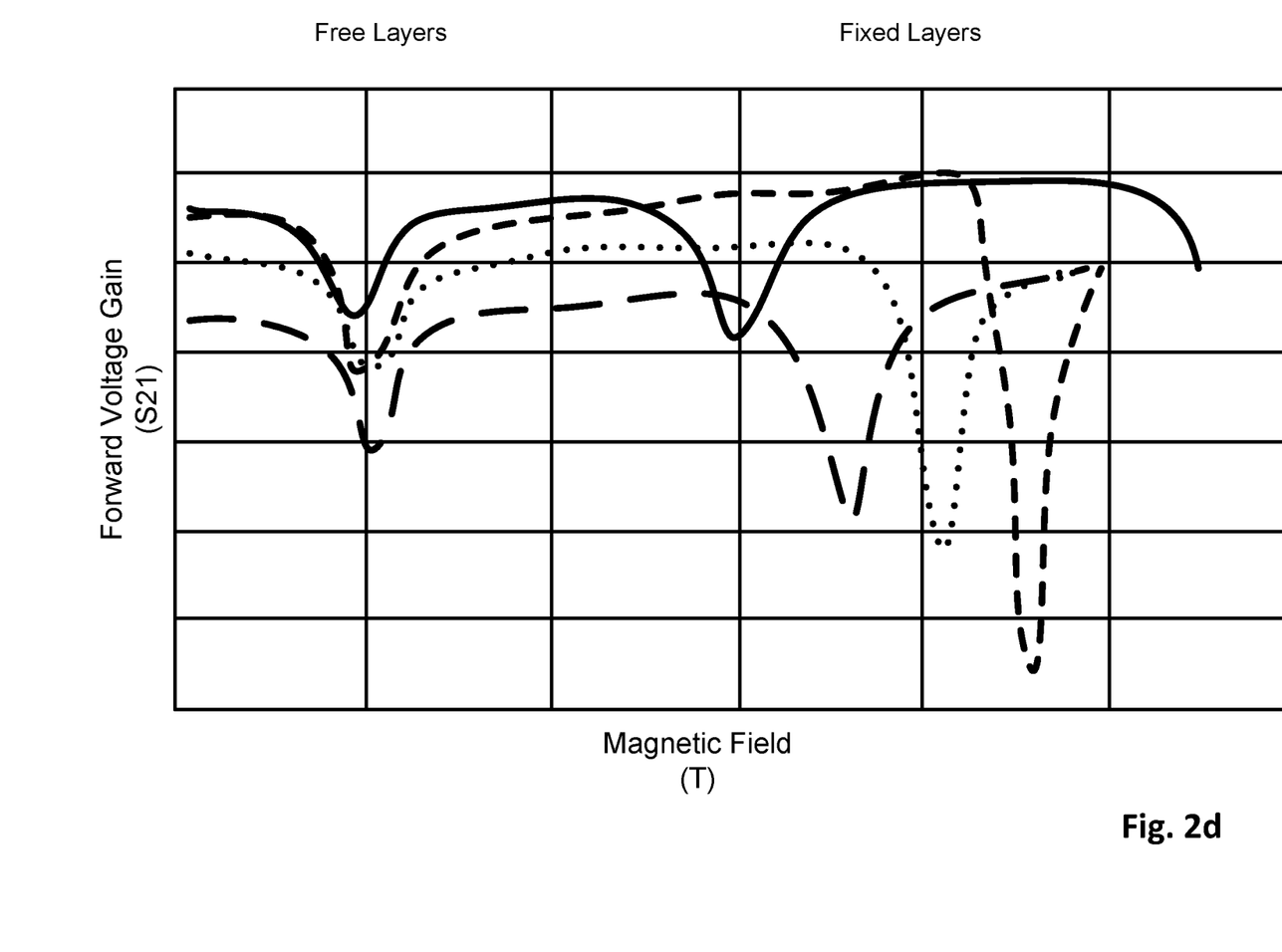
FIG. 2d illustrates example frequency response plots generated using the testing methodology of FIG. 2a, each plot corresponding to the resonance of a different magnetic layer of one or more whole wafers, in accordance with an embodiment of the present disclosure.

FIG. 2d illustrates example frequency response plots generated using the testing methodology of FIG. 2a, each plot corresponding to the resonance of a different magnetic layer of one or more whole wafers, in accordance with an embodiment of the present disclosure. The four plots shown may be from four different wafers, or from four different magnetic layers of the same wafer. The frequency or sweep range as well as the DC magnetic field can be changed for each layer as appropriate, but may be the same for some layers at different locations within the same wafer. Note that the free layers all have about the same performance, while the fixed layers each have a different resonant frequency. With this knowledge the free layer dynamics and the fixed layer dynamics can be separated.

Example Integrated Circuits with Buried Magnetic Layers

Figure 3A:
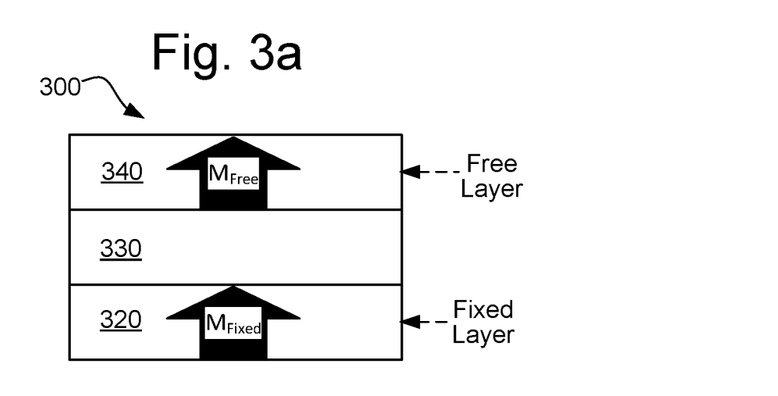
FIG. 3a illustrates a cross-section, schematic view of an example perpendicular magnetic tunnel junction (MTJ) in its parallel state.
Figure 3B:
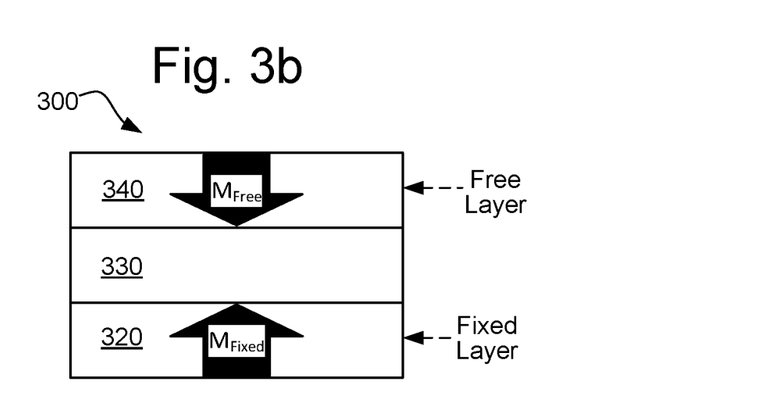
FIG. 3b illustrates a cross-section, schematic view of the corresponding perpendicular MTJ in its anti-parallel state.

FIG. 3a illustrates a cross-section, schematic view of an example perpendicular magnetic tunnel junction (MTJ) in its parallel state, and FIG. 3b illustrates a cross-section, schematic view of the corresponding perpendicular MTJ in its anti-parallel state. Such structure can be tested and verified using the techniques provided herein. While the particular being tested is not particularly relevant, example structures are provided to give some context as to types of integrated circuitry to which the techniques can be applied. The example structures illustrated are in no way intended to limit the present disclosure.

FIG. 3a is a cross-section, schematic view of a conventional perpendicular MTJ 300 in its parallel (P) state. FIG. 3b is a cross-section, schematic view of the perpendicular MTJ 300 of FIG. 3a in its anti-parallel (AP) state. As can be seen, perpendicular MTJ 300 is a layered structure including a first (fixed) ferromagnetic layer 320, an insulator layer 330, and a second (free) ferromagnetic layer 340, stacked as shown. The fixed layer, sometimes referred to as being pinned, does not normally undergo changes in its magnetization ($M_{Fixed}$)—its direction of magnetization remains fixed and serves as a reference. On the other hand, the free layer, sometimes referred to as being dynamic, does undergo changes in the direction of its magnetization ($M_{Free}$).

In FIG. 3a, fixed ferromagnetic layer 320 and free ferromagnetic layer 340 have magnetizations—$M_{Fixed}$ and $M_{Free}$, respectively—in the same direction (perpendicular MTJ 300 is in its P state). In the P state, electrons with spins oriented parallel to the magnetization (spin-up electrons) readily pass from the fixed ferromagnetic layer 320 through the insulator layer 330 to the free ferromagnetic layer 340, while electrons with spins oriented anti-parallel to the magnetization (spin-down electrons) are strongly scattered. The spin-up electrons can tunnel through the insulator barrier 330 because there is a sufficiently high quantity of unoccupied spin-up states available in the free ferromagnetic layer 340. As a result, P-state MTJ 300 has a low resistivity for electrons with spins oriented parallel to the magnetization and a high resistivity for electrons with spins oriented anti-parallel to the magnetization. Otherwise put, it is more likely that electrons will tunnel (a current will pass) through the insulating layer 330 in the P state (low resistance state) of perpendicular MTJ 300 than in the AP state, a discussion of which now follows. In FIG. 3b, $M_{Fixed}$ and $M_{Free}$ are in opposing directions (perpendicular MTJ 300 is in its AP state). In the AP state, electrons of both types of spins (spin-up and spin-down electrons) are strongly scattered. Quantum tunneling is suppressed in this instance because there are fewer spin-up states available (as compared to the P state previously discussed with reference to FIG. 3a). As a result, AP-state MTJ 300 has a high resistivity for electrons regardless of spin orientation. Otherwise put, it is less likely that electrons will tunnel (a current will pass) through the insulating layer 330 in the AP state (high resistance state) of perpendicular MTJ 300 than in the P state. Many other MTJ stack configurations and variations are possible. For instance, other configurations may include one or more offset layers to introduce an additional internal magnetic field, such as described in U.S. Pat. No. 9,236,562.

Figure 4:
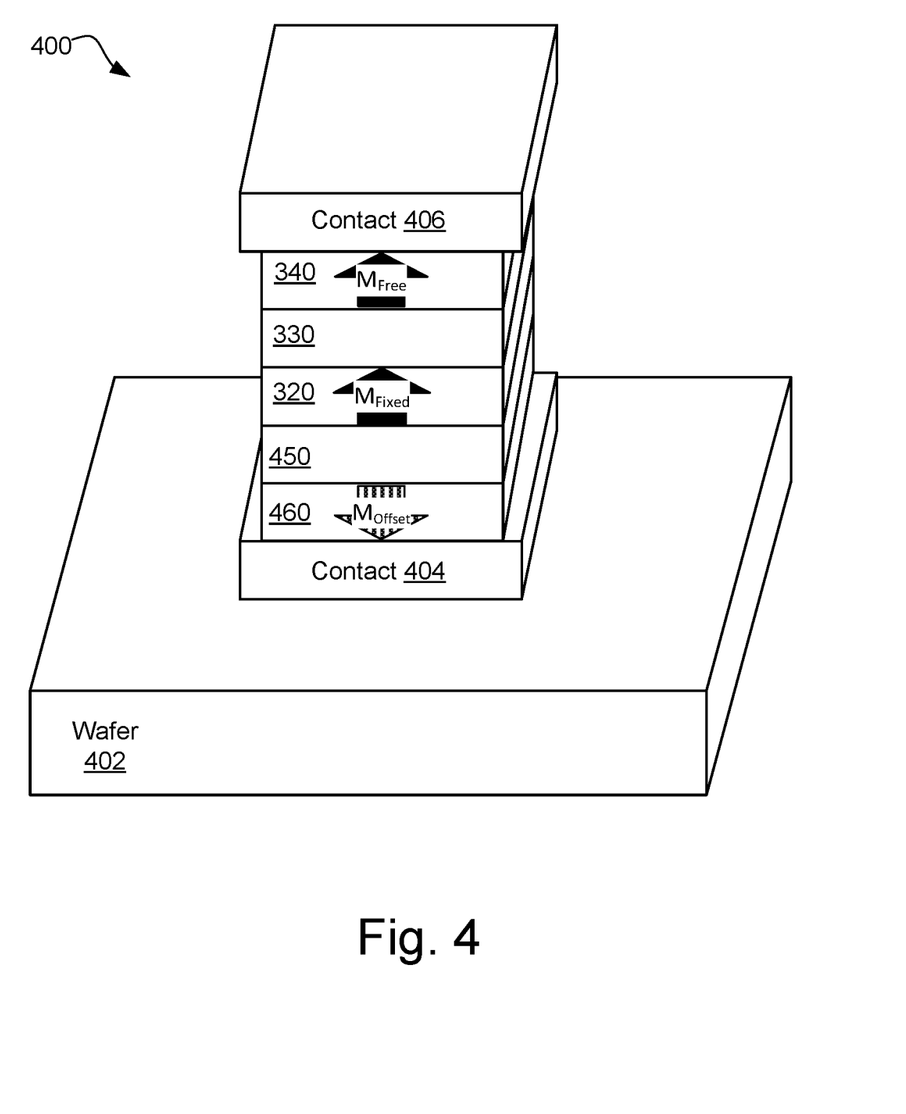
FIG. 4 illustrates a partial cross-section view of integrated circuitry having one or more MTJ configurations such as those shown in FIGS. 3a-b, and which could be part of the whole wafer shown in FIG. 2b, for example.

Moreover additional layers can be provided, such as hard masks, etch stops, and contact layers. FIG. 4 is a perspective, schematic view of an example integrated circuit 400 implementing a perpendicular MTJ. As similarly discussed above with reference to FIG. 3a, here the example perpendicular MTJ is in its P state and includes an additional ferromagnetic layer (offset layer) 460 proximate the fixed layer 320 and a non-magnetic spacer 450 therebetween. Substrate 402 is a whole wafer, although only partially shown. As can be further seen, this example perpendicular MTJ is implemented with metal contacts 404 and 406. Thus, the magnetic layers at 320, 340, and 460 are all buried. As will be appreciated in light of this disclosure, each of these buried magnetic layers will cause a change in the impedance of the waveguide of the test set-up, as shown in FIGS. 1a-c. The frequency response of the waveguide, as measured by the VNA, reflects the change in waveguide impedance. The analysis component of the test system receives the FMR spectra associated with the frequency response of the waveguide (including the impedance changes), and correlate that FMR spectra with magnetic properties of the target buried magnetic layer.

Further Example Embodiments

The following examples pertain to further embodiments, from which numerous permutations and configurations will be apparent.

Example 1 is a method for carrying out wafer level ferromagnetic resonance (FMR) testing, the method comprising: moving a full wafer proximate to a waveguide, such that the waveguide is within 500 microns or less of target measurement point of the wafer but not short-circuited to the wafer, energizing a DC magnetic field proximate to the target measurement point; applying an RF input signal through the waveguide; collecting resonance spectra of the frequency response of the waveguide; and decomposing the resonance spectra into magnetic properties of the target layer.

Example 2 includes the subject matter of Example 1, and further includes: in response to determining there are additional target layers to measure, adjusting at least one of the DC magnetic field and the RF signal and repeating the method at the target measure point.

Example 3 includes the subject matter of Example 1 or 2, and further includes: in response to determining there is a next target measurement point, moving the wafer, such that the waveguide is within 500 microns or less of the next target measurement point but not short-circuited to the wafer, and repeating the method at the next target measure point.

Example 4 includes the subject matter of any of the previous Examples, wherein the magnetic properties of the target layer include magnetic damping.

Example 5 includes the subject matter of any of the previous Examples, wherein the magnetic properties of the target layer include at least one of Hkeff (effective anisotropy field), g (magnetic moment), $\Delta H$ (FMR linewidth), and $\Delta H_0$ (inhomogeneous linewidth broadening).

Example 6 includes the subject matter of any of the previous Examples, wherein the magnetic properties of the target layer include intrinsic threshold current of a perpendicular magnetic tunnel junction (MTJ) structure including the target layer.

Example 7 includes the subject matter of any of the previous Examples, wherein moving the wafer includes commanding a robot to move the wafer.

Example 8 includes the subject matter of any of the previous Examples, wherein a conductor of the waveguide is within 5 microns or less of target measurement point of the wafer but not short-circuited to the wafer. In other embodiments, the conductor of the waveguide is within 10 microns or less of target measurement point of the wafer but not short-circuited to the wafer. In still other embodiments, the conductor of the waveguide is within 50 microns or less of target measurement point of the wafer but not short-circuited to the wafer. In still other embodiments, the conductor of the waveguide is within 100 microns or less of target measurement point of the wafer but not short-circuited to the wafer.

Example 9 includes the subject matter of any of the previous Examples, wherein the wafer is a 300 mm wafer populated with one or more buried magnetic layers. In some cases, the wafer is populated with integrated circuitry that includes magnetic tunnel junction (MTJ) devices, such as a non-volatile memory integrated circuit or processor integrated circuit or a communications integrated circuit.

Example 10 includes the subject matter of any of the previous Examples, wherein at least one of: the DC magnetic field is swept in the range of 0 T to 3 T; and the RF input signal is swept in the range of 2 GHz to 70 GHz, at a power level in the range of −10 dBm to +10 dBm. As will be appreciated in light of this disclosure, the sweeping may be accomplished in a continuous fashion or in an incremental step fashion.

Example 11 includes a computer program product including one or more non-transitory machine readable mediums encoded with instructions that when executed by one or more processors cause a process to be carried out for wafer level ferromagnetic resonance (FMR) testing, the process comprising: moving a full wafer proximate to a waveguide, such that the waveguide is within 500 microns or less of target measurement point of the wafer but not short-circuited to the wafer; energizing a DC magnetic field proximate to the target measurement point; applying an RF input signal through the waveguide; collecting resonance spectra of the frequency response of the waveguide; and decomposing the resonance spectra into magnetic properties of the target layer. The non-transitory machine readable mediums may be any physical memory facility, such as ROM, RAM, DRAM, hard disk, diskette, thumb drive, compact disk, solid state drive, on-board chip memory or cache, etc.

Example 12 includes the subject matter of Example 11, the process further comprising: in response to determining there are additional target layers to measure, adjusting at least one of the DC magnetic field and the RF signal and repeating the process at the target measure point.

Example 13 includes the subject matter of Example 11 or 12, the process further comprising: in response to determining there is a next target measurement point, moving the wafer, such that the waveguide is within 500 microns or less of the next target measurement point but not short-circuited to the wafer, and repeating the process at the next target measure point.

Example 14 includes the subject matter of any of Examples 11 through 13, wherein the magnetic properties of the target layer include magnetic damping.

Example 15 includes the subject matter of any of Examples 11 through 14, wherein the magnetic properties of the target layer include at least one of Hkeff (effective anisotropy field), g (magnetic moment), $\Delta H$ (FMR linewidth), and $\Delta H_0$ (inhomogeneous linewidth broadening).

Example 16 includes the subject matter of any of Examples 11 through 15, wherein the magnetic properties of the target layer include intrinsic threshold current of a perpendicular magnetic tunnel junction (MTJ) structure including the target layer.

Example 17 includes the subject matter of any of Examples 11 through 16, wherein moving the wafer includes commanding a robot to move the wafer.

Example 18 includes the subject matter of any of Examples 11 through 13, wherein a conductor of the waveguide is within 5 microns or less of target measurement point of the wafer but not short-circuited to the wafer. Other distances will be appreciated in light of this disclosure (see, for instance, Example 8).

Example 19 includes the subject matter of any of Examples 11 through 18, wherein the wafer is a 300 mm wafer populated with one or more buried magnetic layers.

Example 20 includes the subject matter of any of Examples 11 through 13, wherein at least one of: the DC magnetic field is swept in the range of 0 T to 3 T; and the RF input signal is swept in the range of 2 GHz to 70 GHz, at a power level in the range of −10 dBm to +10 dBm.

Example 21 includes a system for wafer level ferromagnetic resonance (FMR) testing. The system includes a memory for storing instructions, and a processor configured to execute the instructions to: move a full wafer proximate to a waveguide, such that the waveguide is within 500 microns or less of target measurement point of the wafer but not short-circuited to the wafer; energize a DC magnetic field proximate to the target measurement point; apply an RF input signal through the waveguide; collect resonance spectra of the frequency response of the waveguide; and decompose the resonance spectra into magnetic properties of the target layer. The system may be, for example, a computer system such as a desktop, laptop, tablet, or smartphone. Alternatively, the system may be a microcontroller, or some other environment capable of executing the functionality.

Example 22 includes the subject matter of Example 21, wherein the processor is further to: in response to determining there are additional target layers to measure, adjust at least one of the DC magnetic field and the RF signal and repeating the process at the target measure point.

Example 23 includes the subject matter of Example 21 or 22, wherein the processor is further to: in response to determining there is a next target measurement point, move the wafer, such that the waveguide is within 500 microns or less of the next target measurement point but not short-circuited to the wafer and repeating the process at the next target measure point.

Example 24 includes the subject matter of any of Examples 21 through 23, wherein the magnetic properties of the target layer include magnetic damping.

Example 25 includes the subject matter of any of Examples 21 through 24, wherein the magnetic properties of the target layer include at least one of Hkeff (effective anisotropy field), g (magnetic moment), $\Delta H$ (FMR linewidth), and $\Delta H_0$ (inhomogeneous linewidth broadening).

Example 26 includes the subject matter of any of Examples 21 through 25, wherein the magnetic properties of the target layer include intrinsic threshold current of a perpendicular magnetic tunnel junction (MTJ) structure including the target layer.

Example 27 includes the subject matter of any of Examples 21 through 26, wherein moving the wafer includes commanding a robot to move the wafer.

Example 28 includes the subject matter of any of Examples 21 through 27, wherein a conductor of the waveguide is within 5 microns or less of target measurement point of the wafer but not short-circuited to the wafer. Other distances will be appreciated in light of this disclosure (see, for instance, Example 8).

Example 29 includes the subject matter of any of Examples 21 through 27, wherein the wafer is a 300 mm wafer populated with one or more buried magnetic layers.

Example 30 includes the subject matter of any of Examples 21 through 29, wherein at least one of: the DC magnetic field is swept in the range of 1 T to 2 T; and the RF input signal is swept in the range of 2 GHz to 70 GHz, at a power level in the range of −10 dBm to +10 dBm.

The foregoing description of example embodiments of the present disclosure has been presented for the purposes of illustration and description. It is not intended to be exhaustive or to limit the disclosure to the precise forms disclosed. Many modifications and variations are possible in light of this disclosure. It is intended that the scope of the present disclosure be limited not by this detailed description, but rather by the claims appended hereto.

What is claimed is:

1. A method for carrying out wafer level ferromagnetic resonance (FMR) testing, the method comprising:
    moving a full wafer proximate to a waveguide, such that the waveguide is within 500 microns or less of a target measurement point of a target layer of the wafer but not short-circuited to the wafer;
    energizing a DC magnetic field proximate to the target measurement point;
    applying an RF input signal through the waveguide;
    collecting resonance spectra of the frequency response of the waveguide; and
    decomposing the resonance spectra into magnetic properties of the target layer.

2. The method of claim 1, further comprising at least one of:
    in response to determining there are additional target layers to measure, adjusting at least one of the DC magnetic field and the RF signal and repeating the method at the target measure point; and
    in response to determining there is a next target measurement point, moving the wafer, such that the waveguide is within 500 microns or less of the next target measurement point but not short-circuited to the wafer, and repeating the method at the next target measure point.

3. The method of claim 1, wherein the magnetic properties of the target layer include at least one of magnetic damping, Hkeff (effective anisotropy field), g (magnetic moment), $\Delta H$ (FMR linewidth), and $\Delta H_0$ (inhomogeneous linewidth broadening).

4. The method of claim 1, wherein the magnetic properties of the target layer include intrinsic threshold current of a perpendicular magnetic tunnel junction (MTJ) structure including the target layer.

5. The method of claim 1, wherein a conductor of the waveguide is within 5 microns or less of target measurement point of the wafer but not short-circuited to the wafer.

6. The method of claim 1, wherein the wafer is a 300 mm wafer populated with one or more buried magnetic layers.

7. The method of claim 1, wherein at least one of:
    the DC magnetic field is swept in the range of 0 T to 3 T; and
    the RF input signal is swept in the range of 2 GHz to 70 GHz, at a power level in the range of −10 dBm to +10 dBm.

8. A computer program product including one or more non-transitory machine readable mediums encoded with instructions that when executed by one or more processors cause a process to be carried out for wafer level ferromagnetic resonance (FMR) testing, the process comprising:

moving a full wafer proximate to a waveguide, such that the waveguide is within 500 microns or less of a target measurement point of a target layer of the wafer but not short-circuited to the wafer;

energizing a DC magnetic field proximate to the target measurement point;

applying an RF input signal through the waveguide;

collecting resonance spectra of the frequency response of the waveguide; and decomposing the resonance spectra into magnetic properties of the target layer.

9. The computer program product of claim 8, the process further comprising at least one of:

in response to determining there are additional target layers to measure, adjusting at least one of the DC magnetic field and the RF signal and repeating the process at the target measure point; and in response to determining there is a next target measurement point, moving the wafer, such that the waveguide is within 500 microns or less of the next target measurement point but not short-circuited to the wafer, and repeating the process at the next target measure point.

10. The computer program product of claim 8, wherein the magnetic properties of the target layer include magnetic damping.

11. The computer program product of claim 8, wherein the magnetic properties of the target layer include at least one of Hkeff (effective anisotropy field), g (magnetic moment), ΔH (FMR linewidth), and $\Delta H_0$ (inhomogeneous linewidth broadening).

12. The computer program product of claim 8, wherein the magnetic properties of the target layer include intrinsic threshold current of a perpendicular magnetic tunnel junction (MTJ) structure including the target layer.

13. The computer program product of claim 8, wherein moving the wafer includes commanding a robot to move the wafer.

14. The computer program product of claim 8, wherein a conductor of the waveguide is within 5 microns or less of target measurement point of the wafer but not short-circuited to the wafer.

15. The computer program product of claim 8, wherein the wafer is a 300 mm wafer populated with one or more buried magnetic layers.

16. The computer program product of claim 8, wherein at least one of:

the DC magnetic field is swept in the range of 0 T to 3 T; and the RF input signal is swept in the range of 2 GHz to 70 GHz, at a power level in the range of −10 dBm to +10 dBm.

17. A system for wafer level ferromagnetic resonance (FMR) testing, the system comprising:

a memory for storing instructions;

a processor configured to execute the instructions to:

move a full wafer proximate to a waveguide, such that the waveguide is within 500 microns or less of a target measurement point of a target layer of the wafer but not short-circuited to the wafer;

energize a DC magnetic field proximate to the target measurement point;

apply an RF input signal through the waveguide;

collect resonance spectra of the frequency response of the waveguide; and decompose the resonance spectra into magnetic properties of the target layer.

18. The system of claim 17, the processor further to at least one of:

in response to determining there are additional target layers to measure, adjust at least one of the DC magnetic field and the RF signal and repeating the process at the target measure point; and in response to determining there is a next target measurement point, move the wafer, such that the waveguide is within 500 microns or less of the next target measurement point but not short-circuited to the wafer and repeating the process at the next target measure point.

19. The system of claim 17, wherein the magnetic properties of the target layer include one or more of magnetic damping, Hkeff (effective anisotropy field), g (magnetic moment), ΔH (FMR linewidth), $\Delta H_0$ (inhomogeneous linewidth broadening), or intrinsic threshold current of a perpendicular magnetic tunnel junction (MTJ) structure including the target layer.

20. The system of claim 17, wherein at least one of:

the DC magnetic field is swept in the range of 1 T to 2 T; and the RF input signal is swept in the range of 2 GHz to 70 GHz, at a power level in the range of −10 dBm to +10 dBm.

* * * * *